(12) United States Patent
Sakai et al.

(10) Patent No.: US 8,030,678 B2
(45) Date of Patent: Oct. 4, 2011

(54) OPTICAL SEMICONDUCTOR DEVICE MODULE HAVING LEAF SPRINGS WITH DIFFERENT RECTANGULARLY-SHAPED TERMINALS

(75) Inventors: Takaaki Sakai, Chiba (JP); Kazuhiko Ueno, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 181 days.

(21) Appl. No.: 12/506,651

(22) Filed: Jul. 21, 2009

(65) Prior Publication Data

US 2010/0025721 A1 Feb. 4, 2010

(30) Foreign Application Priority Data

Jul. 23, 2008 (JP) ................................. 2008-189498

(51) Int. Cl.
*H01L 33/00* (2010.01)
(52) U.S. Cl. .............................. 257/99; 257/98; 257/433
(58) Field of Classification Search ............ 257/88–103, 257/431–448, E33.072, E33.059, E33.065, 257/E33.057
See application file for complete search history.

(56) References Cited

U.S. PATENT DOCUMENTS

2010/0044745 A1* 2/2010 Sakai et al. ...................... 257/99
2011/0001227 A1* 1/2011 Ano ............................... 257/676

FOREIGN PATENT DOCUMENTS

| JP | 2003-101072 A | 4/2003 |
| JP | 2003-243721 A | 8/2003 |
| JP | 2003-331635 A | 11/2003 |
| JP | 2003-347598 A | 12/2003 |
| JP | 2006-066108 A | 3/2006 |
| JP | 2006-302714 A | 11/2006 |
| JP | 2007-141549 A | 6/2007 |
| JP | 2007-242267 A | 9/2007 |

* cited by examiner

*Primary Examiner* — Cuong Q Nguyen
(74) *Attorney, Agent, or Firm* — Kenealy Vaidya LLP

(57) ABSTRACT

In an optical semiconductor device module constructed by an optical semiconductor device having a light emitting portion on its top surface, a mounting substrate adapted to mount the optical semiconductor device thereon, and at least one conductive leaf spring adapted to fix the optical semiconductor device to the mounting substrate and supply power to the optical semiconductor device, the leaf spring is formed by a plurality of rectangularly-shaped terminals, and natural frequencies of at least two of the rectangularly-shaped terminals are different from each other.

18 Claims, 14 Drawing Sheets

Fig. 12

NATURAL FREQUENCY OF FIRST-ORDER OSCILLATION (kHz)

| MATERIAL | LENGTH (mm) | | | | |
|---|---|---|---|---|---|
| | 1 | 2 | 3 | 4 | 5 |
| BRASS | 2409 | 602 | 268 | 151 | 96 |
| COPPER | 2593 | 648 | 288 | 162 | 104 |
| ALUMINIUM | 3634 | 908 | 404 | 227 | 145 |
| SUS304 | 3499 | 875 | 389 | 219 | 140 |
| GOLD | 1443 | 361 | 160 | 90 | 58 |
| SILVER | 1924 | 481 | 214 | 120 | 77 |

OPTICAL SEMICONDUCTOR DEVICE MODULE HAVING LEAF SPRINGS WITH DIFFERENT RECTANGULARLY-SHAPED TERMINALS

This application claims the priority benefit under 35 U.S.C. §119 to Japanese Patent Application No. JP2008-189498 filed on 23 Jul. 2008, which disclosure is hereby incorporated in its entirety by reference.

BACKGROUND

1. Field

The presently disclosed subject matter relates to an optical semiconductor device module used in a head lamp or the like of a vehicle.

2. Description of the Related Art

Generally, in the same way as a chip resistor module and a chip capacitor module, an optical semiconductor device module or a light emitting diode (LED) module mounted on a vehicle is constructed by fixing an LED element to a mounting substrate, using solder portions, screws or spot welds, which will be explained later in detail.

However, when the LED element is fixed directly to the mounting substrate using solder portions, screws or spot welds, cracks could occur in the solder portions, the lead frames could be deformed, or the LED element could break down. This also will be explained later in detail.

In order to easily replace the LED element with a new one, other approaches are to press lead frames onto a mounting substrate by a detachable cover (see: JP-2003-101072A), to press lead frames onto a mounting substrate by metal plates (see: JP-2003-243721A), to fix lead frames to a mounting substrate by a locking component (see: JP-2003-331635A), to press lead frames onto a mounting substrate by fitting metal plates (see: JP-2003-347598A), and to fix lead frames to a housing by fitting attachments (see: JP-2006-066108A, JP-2006-302714A and JP-2007-141549A).

However, when the metal plates or attachments are used, an opening for the LED element is required in the metal plates or attachments, so that the light emitting portion and lens of the LED element could be damaged which would invite the reduction of light flux and the deterioration of light distribution. On the other hand, when the metal plates or attachments are fitted into the mounting substrate or housing, the contact characteristics of a new LED element could deteriorate after the metal plates or attachments are again fitted into the mounting substrate or housing.

A further prior art optical semiconductor device module is constructed by an LED element having a light emitting portion on its top surface, a mounting substrate for mounting the LED element thereon, and two conductive leaf springs for fixing the LED element to the mounting substrate and supplying power to the LED element. In this case, each of the leaf springs is formed by a plurality of rectangularly-shaped terminals of the same shape (see: FIG. 15 of JP-2007-141549A).

In the further prior art optical semiconductor device module, however, since the rectangularly-shaped terminals have the same shape so that their natural frequencies are the same, when one of the rectangularly-shaped terminals vibrates due to vibration of a vehicle, the other rectangularly-shaped terminals simultaneously vibrate, i.e., resonate. Thus, the vibration of the leaf springs is enhanced, so that lightening and darkening of the LED element would be repeated, and at worst, the LED element would be separated from the mounting substrate.

SUMMARY

The presently disclosed subject matter seeks to solve one or more of the above-described problems.

According to the presently disclosed subject matter, in an optical semiconductor device module constructed by an optical semiconductor device having a light emitting portion on its top surface, a mounting substrate adapted to mount the optical semiconductor device thereon, and at least one conductive leaf spring adapted to fix the optical semiconductor device to the mounting substrate and supply power to the optical semiconductor device, the leaf spring is formed by a plurality of rectangularly-shaped terminals, and natural frequencies of at least two of the rectangularly-shaped terminals are different from each other. As a result, even when one of the rectangularly-shaped terminals vibrates at its natural frequency, the other rectangularly-shaped terminals never vibrate simultaneously.

Also, lengths, materials, geometrical shapes, thicknesses, or cross sections of the at least two rectangularly-shaped terminals are different from each other.

Further, a screw, a rivet, a press pin or a hook member is provided to fix the leaf spring to the mounting substrate.

The mounting substrate includes a heat sink.

A heat dissipating grease layer is provided between the optical semiconductor device and the mounting substrate.

When there are two leaf springs, the rectangularly-shaped terminals of one of the leaf springs are symmetrical to those of the other with respect to the optical semiconductor device.

According to the presently disclosed subject matter, since the rectangularly-shaped terminals never simultaneously vibrate, i.e., never resonate, the vibration of the leaf spring can be suppressed, and repeated lightening and darkening of the optical semiconductor device can be prevented. The optical semiconductor device would thus hardly be separated from the mounting substrate due to the vibration of the rectangularly-shaped terminals.

BRIEF DESCRIPTION OF THE DRAWINGS

The above and other advantages and features of the presently disclosed subject matter will be more apparent from the following description of certain embodiments, as compared with the prior art, taken in conjunction with the accompanying drawings, wherein:

FIG. 12 is a table showing natural frequencies of first-order oscillation of material used in the rectangularly-shaped terminals of FIG. 10;

DETAILED DESCRIPTION OF EXEMPLARY EMBODIMENTS

Before the description of embodiments, prior art optical semiconductor device modules will now be explained with reference to FIGS. 1, 2 and 3.

Figure 1:
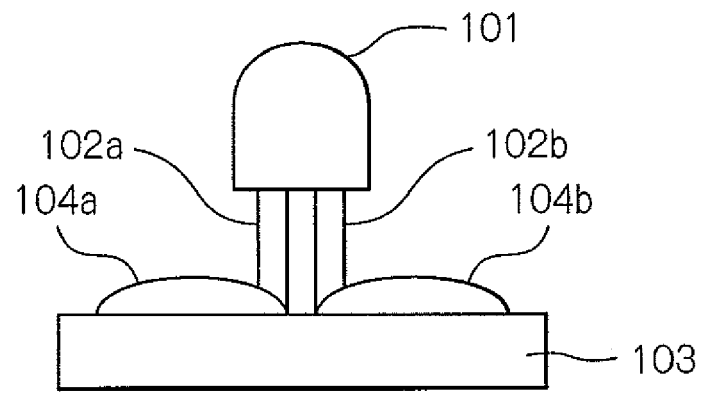
FIG. 1 is a diagram illustrating a first prior art optical semiconductor device module.

In FIG. 1, which illustrates a first prior art optical semiconductor device module, an LED element 101 along with conductive terminals (lead frames) 101a and 101b is mounted on a mounting substrate 103, and then, the lead frames 102a and 102b are fixed to the mounting substrate 103 by solder portions 104a and 104b, respectively.

In the optical semiconductor device module of FIG. 1, however, when a heat load test is carried out, cracks would occur in a connection portion of the solder portions 104a and 104b to the LED element 101 and the mounting substrate 103 due to the difference in linear thermal expansion coefficient between the LED element 101 and the mounting substrate 103. Also, when the optical semiconductor device module of FIG. 1 is mounted at a position in the proximity of an engine, metal diffusion would occur between the lead frames 102a and 102b and the solder portions 104a and 104b in a high temperature environment, to create an intermetallic compound therebetween. Since such an intermetallic compound is mechanically weak, cracks would occur in the solder portions 104a and 104b due to the vibration and impact. As a result, the LED element 101 would be darkened due to the shortage of supplied power, and the heat dissipating characteristics of the LED element 101 would deteriorate. At worst, the LED element 101 would be separated from the mounting substrate 103. Note that Pb-free soldering has been developed for components of vehicles.

Figure 2:
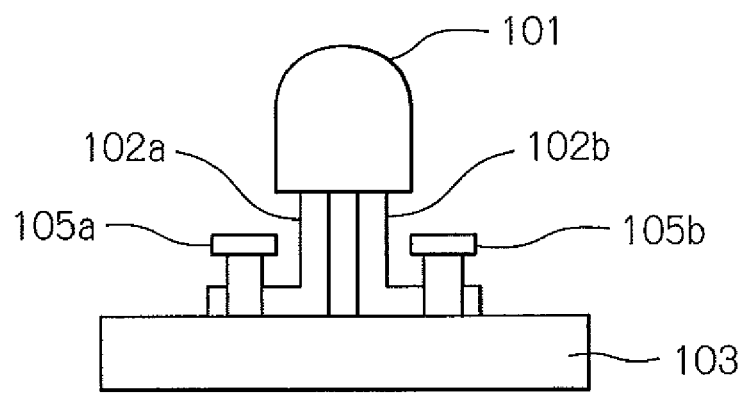
FIG. 2 is a diagram illustrating a second prior art optical semiconductor device module.

In FIG. 2, which illustrates a second prior art optical semiconductor device module, screws 105a and 105b are used instead of the solder portions 104a and 104b of FIG. 1. That is, the lead frames 102a and 102b of the LED element 101 are fixed to the mounting substrate 103 by the screws 105a and 105b.

In the optical semiconductor device module of FIG. 2, however, the rotational torques of the screws 105a and 105b are applied to the lead frames 102a and 102b, respectively, so that the lead frames 102a and 102b would be deformed, which would break down the bonding wire within the LED element 101. As a result, the LED element 101 would be darkened due to the shortage of supplied power.

Figure 3:
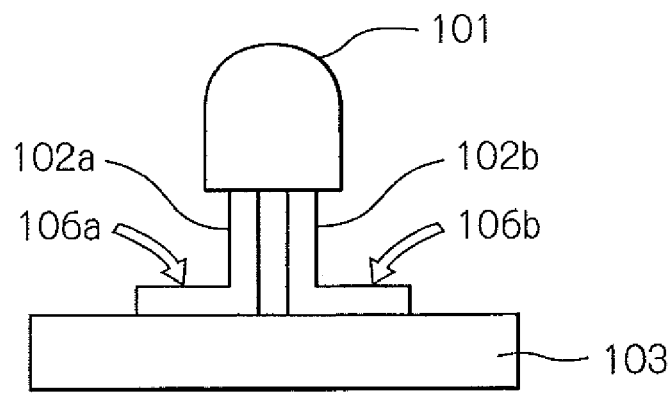
FIG. 3 is a diagram illustrating a third prior art optical semiconductor device module.

In FIG. 3, which illustrates a third prior art optical semiconductor device module, spot welds 106a and 106b are provided instead of the solder portions 104a and 104b of FIG. 1. That is, the lead frames 102a and 102b of the LED element 101 are fixed directly to the mounting substrate 103 by the spot welds 106a and 106b, respectively. As a result, the lead frames 102a and 102b can be firmly secured to the mounting substrate 103 to effectively improve the heat dissipating characteristics from the LED element 101 to the mounting substrate 103.

In the optical semiconductor device module of FIG. 3, however, when the spot welds 106a and 106b are formed, an extremely high voltage is applied to the LED element 101 which can break down the LED element 101 depending upon the polarity of the LED element 101. As a result, the LED element 101 would be darkened due to the broken LED element 101. Also, it is more difficult to exchange the LED element 101 with a new one, as compared with the optical semiconductor device modules of FIGS. 1 and 2.

Figure 4:
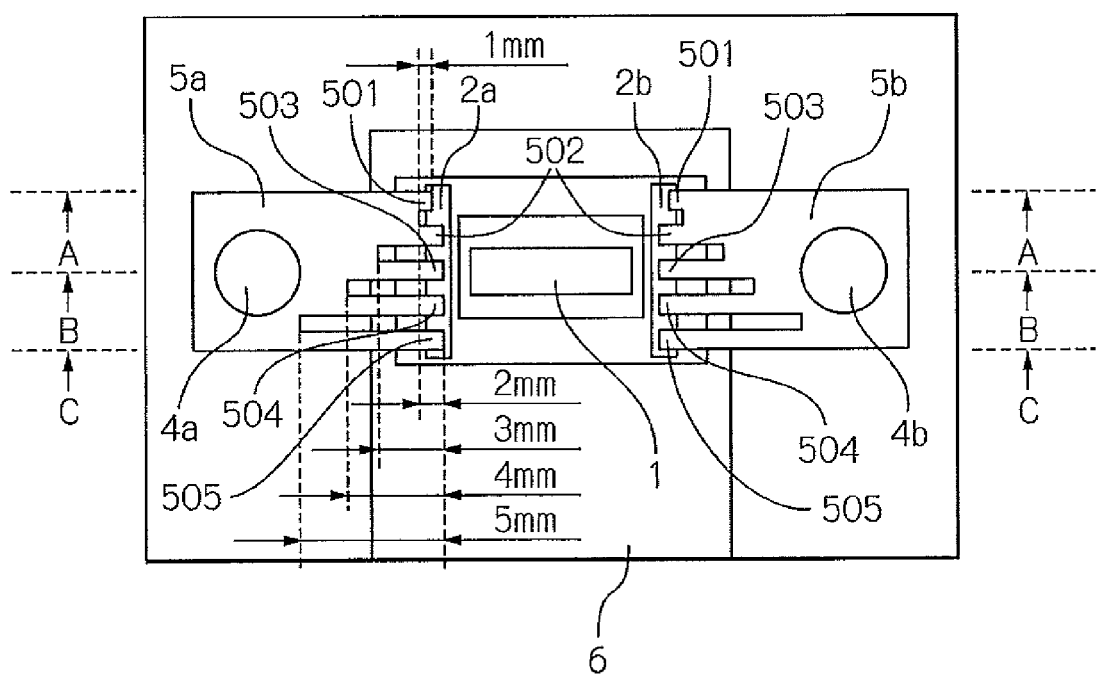
FIG. 4 is a plan view illustrating a first embodiment of the optical semiconductor device module according to the presently disclosed subject matter.
Figure 5A:
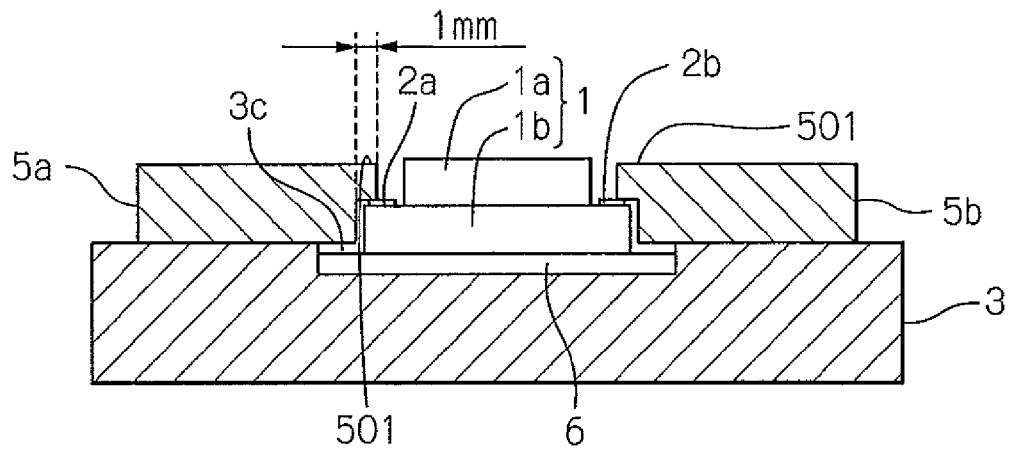
FIGS. 5A, 5B and 5C are cross-sectional views taken along the lines A-A, B-B and C-C, respectively, of FIG. 4.
Figure 5B:
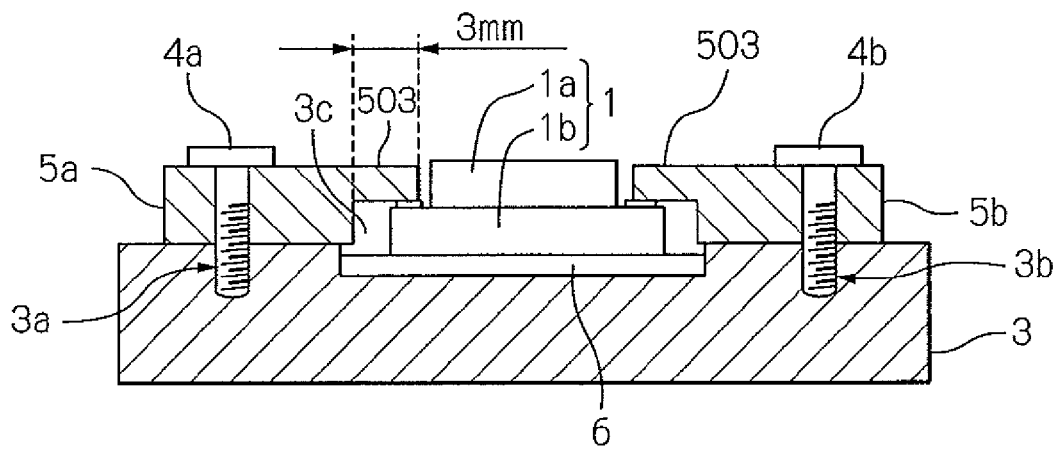
Figure 5C:
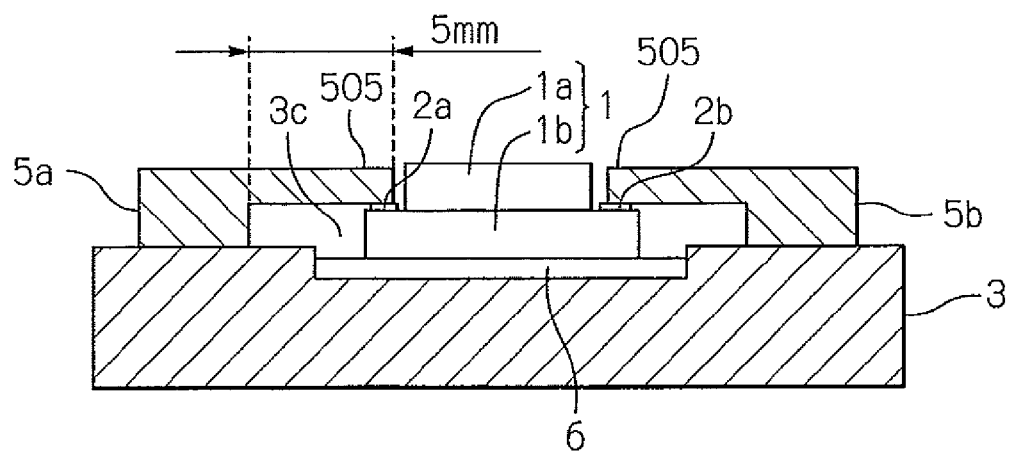

FIG. 4 is a plan view illustrating a first embodiment of the optical semiconductor device module according to the presently disclosed subject matter, and FIGS. 5A, 5B and 5C are cross-sectional views taken along the lines A-A, B-B and C-C, respectively, of FIG. 4.

Referring to FIGS. 4, 5A, 5B and 5C, an LED element 1 has a light emitting portion 1a on its top surface side and a support body 1b on its back surface side.

Lead frames 2a and 2b are connected to an anode and a cathode, respectively, of the LED element 1.

A mounting substrate 3 is used for mounting the LED element 1. The mounting substrate 3 is made of Cu or Al which has excellent workability and mass-productivity.

Also, tapped holes 3a and 3b for receiving screws 4a and 4b are formed in the mounting substrate 3. Further, a groove 3c for receiving the LED element 1 is formed in the mounting substrate 3.

Note that the mounting substrate 3 can include a heat dissipating body such as a heat sink.

Conductive leaf springs 5a and 5b are used for fixing the LED element 1 to the mounting substrate 3, and supplying power to the LED element 1.

The leaf springs 5a and 5b are fixed by the screws 4a and 4b, respectively, to the mounting substrate 3. In this case, the screws 4a and 4b are coated by insulating material (not shown).

The upper surfaces of the leaf springs 5a and 5b are lower than the upper surface of the light emitting portion 1a of the LED element 1, so that the light distribution characteristics of the LED element 1 are not affected by the leaf springs 5a and 5b.

Also, the leaf springs 5a and 5b, particularly their spring portions, can be as thin as possible, so that the leaf springs 5a and 5b provide an excellent spring function.

A silicone heat dissipating grease layer 6 is coated in the groove 3c of the mounting substrate 3. That is, when the LED element 1 is mounted on the groove 3c of the mounting substrate 3, heat is dissipated from the LED element 1 via the silicone heat dissipating grease layer 6 to the mounting substrate 3.

Each of the leaf springs 5a and 5b is constructed by five rectangularly-shaped terminals 501, 502, 503, 504 and 505, each serving as a spring member. The lengths L1, L2, L3, L4 and L5 of the rectangularly-shaped terminals 501, 502, 503, 504 and 505 are different from each other. For example, L1=1 mm
L2=2 mm
L3=3 mm
L4=4 mm
L5=5 mm Therefore, the natural frequencies of the rectangularly-shaped terminals 501, 502, 503, 504 and 505 are different from each other. Here, since each rectangularly-shaped terminal has a fixed end and a support beam end, a natural frequency f of the rectangularly-shaped terminal is calculated by $$f = kn2/2\pi L2 \times (EI/\rho A)^{1/2} \tag{1}$$

where kn is an n-th order oscillation constant, for example, k1=3.927, k2=7.069, k3=10.210, . . . ;

L is a length of the rectangularly-shaped terminal;

E is a Young's modulus of the rectangularly-shaped terminal;

I is a geometrical moment of inertia of the rectangularly-shaped terminal;

ρ is a density of the rectangularly-shaped terminal; and

A is a cross section of the rectangularly-shaped terminal.

Therefore, if the rectangularly-shaped terminals 501, 502, 503, 504 and 505 are made of copper (Cu) and have the same thickness of 1 mm and the same width of 1 mm, and the following conditions are satisfied:

$$L2=1.8L1 \quad (2)$$

$$L3=2.6L1 \quad (3)$$

$$L4=3.4L1 \quad (4)$$

$$L5=4.2L1 \quad (5)$$

Then, the rectangularly-shaped terminals 501, 502, 503, 504 and 505 simultaneously vibrate, i.e., resonate, to repeated lighten and darken the LED element 1. At worst, the LED element 1 would be separated from the mounting substrate 3. However, in the optical semiconductor device module of FIG. 4, since L1=1 mm, L2=2 mm, L3=3 mm, L4=4 mm and L5=5 mm, the formulae (2), (3), (4) and (5) are never satisfied, which would suppress the vibration (resonance) of the rectangularly-shaped terminals 501, 502, 503, 504 and 505. Therefore, repeated lightening and darkening of the LED element 1 and separation of the LED element 1 from the mounting substrate 3 can be prevented.

Figure 6A:
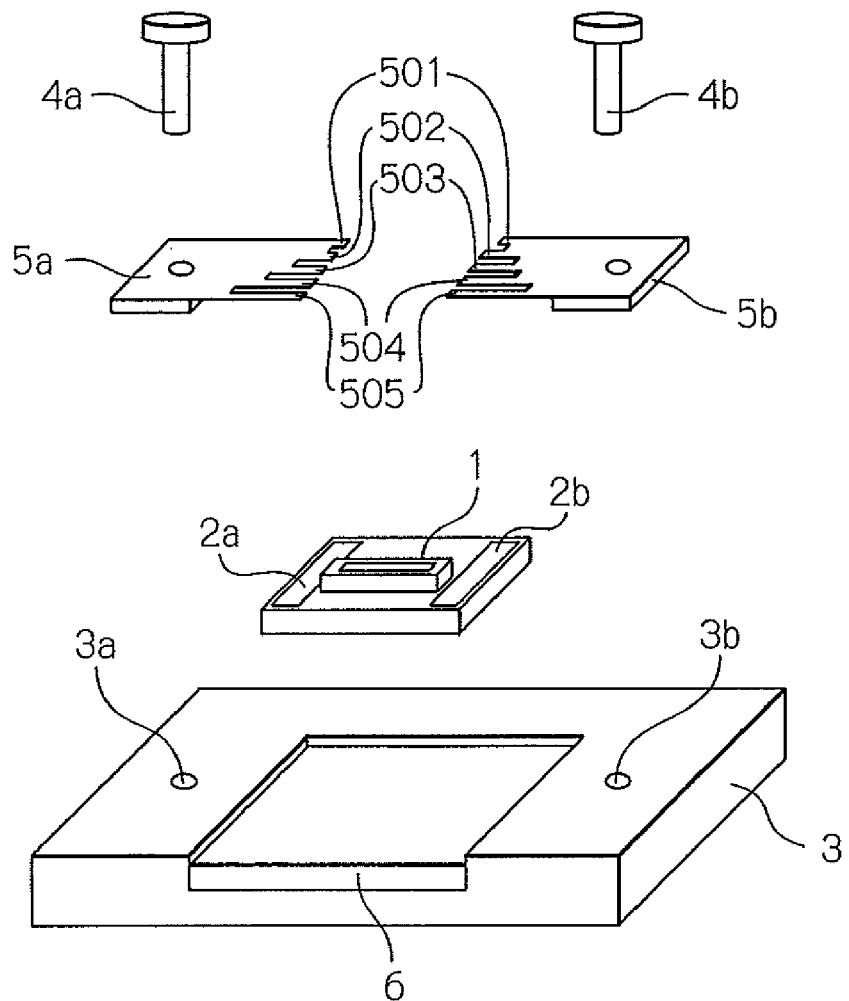
FIGS. 6A and 6B are an exploded view and a perspective view of the optical semiconductor device module of FIG. 4.
Figure 6B:
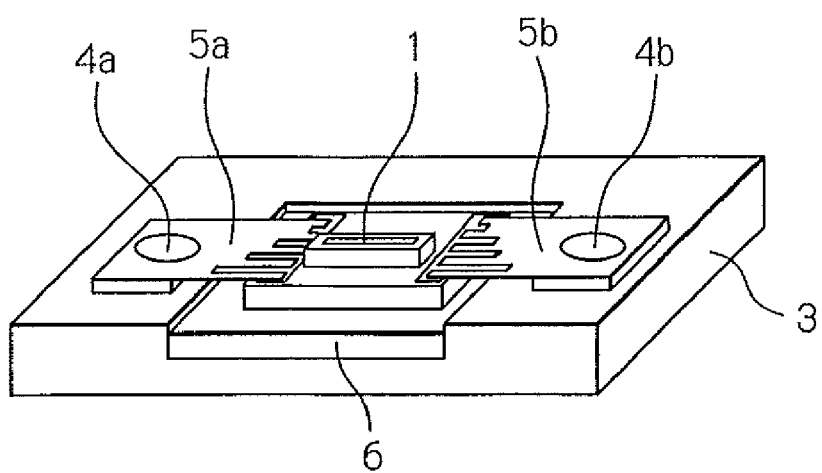

An assembling method of the optical semiconductor device module of FIG. 4 will be explained next with reference to FIGS. 6A and 6B. Note that FIGS. 6A and 6B are an exploded view and a perspective view, respectively, of the optical semiconductor device module of FIG. 4.

First, the silicone heat dissipating grease layer 6 is coated in the groove 3c of the mounting substrate 3.

Next, the LED element 1 is mounted on the silicone heat dissipating grease layer 6.

Finally, the LED element 1 is pushed by the leaf springs 5a and 5b. In this case, while the rectangularly-shaped terminals 501, 502, 503, 504 and 505 are in contact with the lead frames 2a and 2b, the leaf springs 5a and 5b are fixed to the mounting substrate 3 by the screws 4a and 4b. Thus, the optical semiconductor device module of FIGS. 6A and 6B is completed.

Note that the rectangularly-shaped terminals 501, 502, 503, 504 and 505 of the leaf springs 5a and 5b can be formed by perforating openings in one leaf spring.

Figure 7:
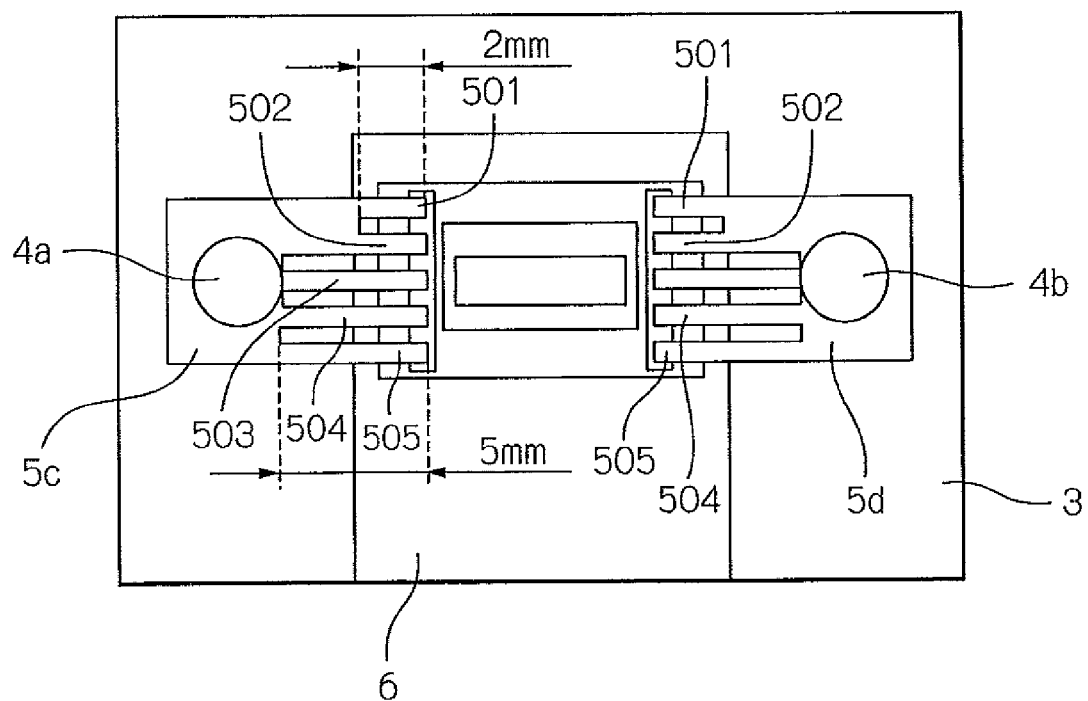
FIGS. 7, 8 and 9 are plan views illustrating first, second and third modifications, respectively, of the optical semiconductor device module of FIG. 4.

In FIG. 7, which illustrates a first modification of the optical semiconductor device module of FIG. 4, leaf springs 5c and 5d are provided instead of the leaf springs 5a and 5b, respectively, of FIG. 4.

Each of the leaf springs 5c and 5d is constructed by five rectangularly-shaped terminals 501, 502, 503, 504 and 505, whose lengths L1, L2, L3, L4 and L5 are as follows:

L1=2 mm
L2=2 mm
L3=5 mm
L4=5 mm
L5=5 mm

Therefore, the natural frequency of the rectangularly-shaped terminals 501 and 502 is different from that of the rectangularly-shaped terminals 503, 504 and 505. As a result, in each of the leaf springs 5c and 5d, even when the rectangularly-shaped terminals 501 and 502 simultaneously vibrate, i.e., resonate, the rectangularly-shaped terminals 503, 504 and 505 never simultaneously vibrate, i.e., never resonate. Similarly, in each of the leaf springs 5c and 5d, even when the rectangularly-shaped terminals 503, 504 and 505 simultaneously vibrate, i.e., resonate, the rectangularly-shaped terminals 501 and 502 never simultaneously vibrate, i.e., never resonate. Thus, the vibration of the leaf springs 5c and 5d can be suppressed, so that the repeated lightening and darkening of the LED element 1 can be prevented, and the LED element 1 can remain securely fixed to the mounting substrate 3.

In FIG. 7, in each of the leaf springs 5c and 5d, the length of two rectangularly-shaped terminals is different from that of three rectangularly-shaped terminals. However, in each of the leaf springs 5c and 5d, only when the lengths of at least two rectangularly-shaped terminals are different from each other, can the vibration of the leaf springs 5c and 5d be prevented.

Figure 8:
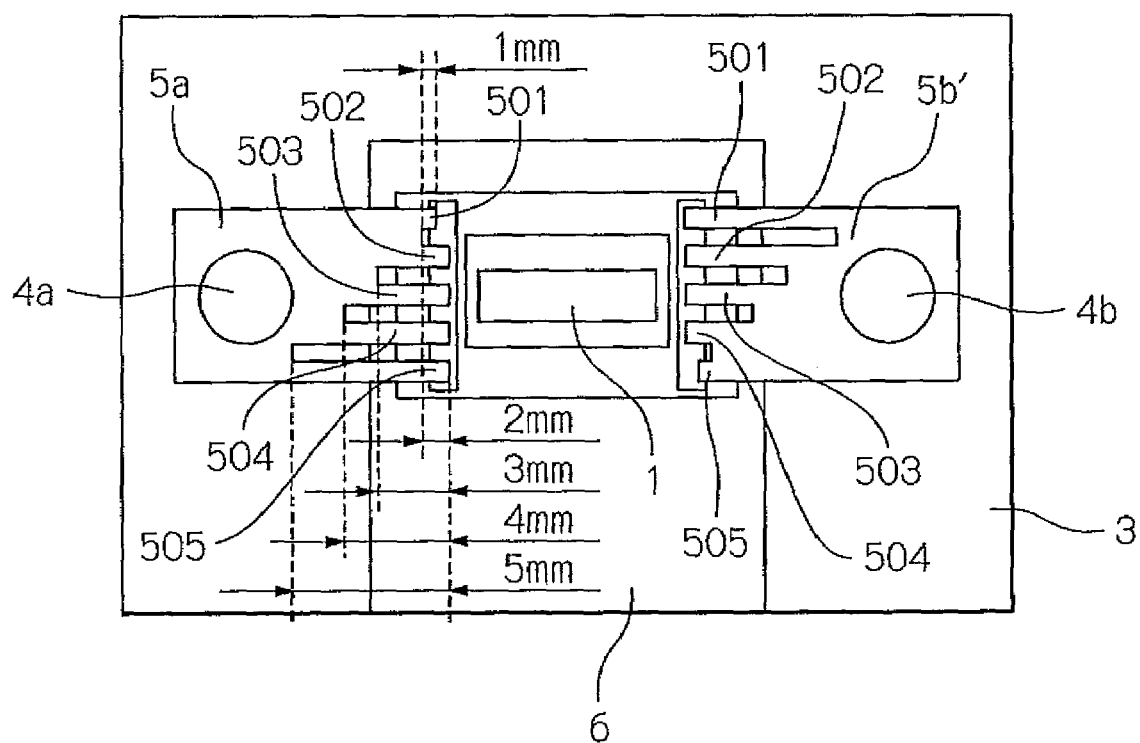

In FIG. 8, which illustrates a second modification of the optical semiconductor device module of FIG. 4, a leaf spring 5b' is provided instead of the leaf spring 5b of FIG. 4.

The sequence of the lengths L1, L2, L3, L4 and L5 of the rectangularly-shaped terminals 501, 502, 503, 504 and 505 of the leaf spring 5b' are reverse to that of the leaf spring 5a of FIG. 4. That is, the rectangularly-shaped terminals 501, 502, 503, 504 and 505 of the leaf spring 5a have lengths L1, L2, L3, L4 and L5 as follows:

L1=1 mm
L2=2 mm
L3=3 mm
L4=4 mm
L5=5 mm

On the other hand, the rectangularly-shaped terminals 501, 502, 503, 504 and 505 of the leaf spring 5b' have lengths L1, L2, L3, L4 and L5 as follows:

L1=5 mm
L2=4 mm
L3=3 mm
L4=2 mm
L5=1 mm

As a result, the rectangularly-shaped terminals 501, 502, 503, 504 and 505 of the leaf spring 5a are symmetrical to the rectangularly-shaped terminals 501, 502, 503, 504 and 505 of the leaf spring 5b' with respect to the LED element 1. Therefore, in each of the leaf springs 5a and 5b, when one of the rectangularly-shaped terminals vibrates, although its diagonally positioned rectangularly-shaped terminal simultaneously vibrates, i.e., resonates, the other rectangularly-shaped terminals never simultaneously vibrate, i.e., never resonate. Thus, the vibration of the leaf springs 5a and 5b' can be suppressed, so that the repeated lightening and darkening of the LED element 1 can be prevented, and the LED element 1 can remain securely fixed to the mounting substrate 3.

Figure 9:
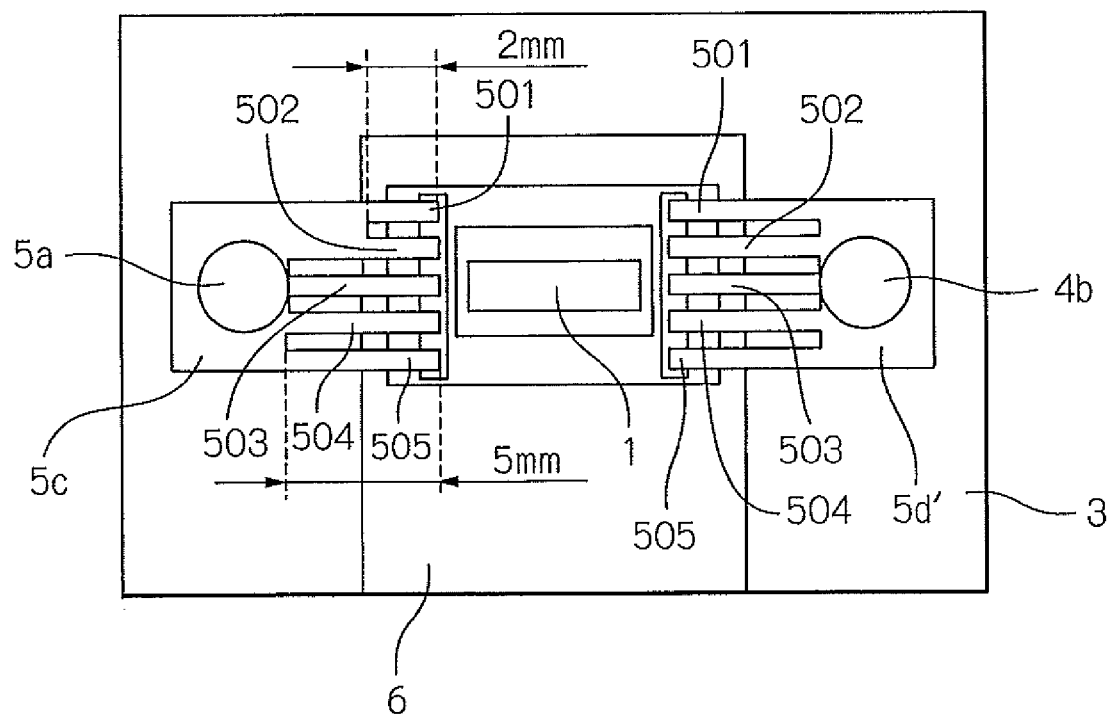

In FIG. 9, which illustrates a third modification of the optical semiconductor device module of FIG. 4, a leaf spring 5d' is provided instead of the leaf spring 5d of FIG. 7.

The third modification can be obtained by combining the first modification with the third modification. That is, the rectangularly-shaped terminals 501, 502, 503, 504 and 505 of the leaf spring 5c have lengths L1, L2, L3, L4 and L5 as follows:

L1=2 mm
L2=2 mm
L3=5 mm
L4=5 mm
L5=5 mm

On the other hand, the rectangularly-shaped terminals 501, 502, 503, 504 and 505 of the leaf spring 5d' have lengths L1, L2, L3, L4 and L5 as follows:

L1=5 mm
L2=5 mm
L3=5 mm
L4=2 mm
L5=2 mm

As a result, even when the rectangularly-shaped terminals 501 and 502 of the leaf spring 5c or the rectangularly-shaped terminals 504 and 505 of the leaf spring 5d' simultaneously vibrate, i.e., resonate, the rectangularly-shaped terminals 503, 504 and 505 of the leaf spring 5c or the rectangularly-shaped terminals 501, 502 and 503 of the leaf spring 5d' never simultaneously vibrate, i.e., never resonate. Similarly, even when the rectangularly-shaped terminals 503, 504 and 505 of the leaf spring 5c or the rectangularly-shaped terminals 501, 502 and 503 of the leaf spring 5d' simultaneously vibrate, i.e., resonate, the rectangularly-shaped terminals 501 and 502 of the leaf spring 5c or the rectangularly-shaped terminals 504 and 505 of the leaf spring 5d' never simultaneously vibrate, i.e., never resonate. Also, the rectangularly-shaped terminals 501, 502, 503, 504 and 505 of the leaf spring 5c are symmetrical to the rectangularly-shaped terminals 501, 502, 503, 504 and 505 of the leaf spring 5d' with respect to the LED element 1. Therefore, in each of the leaf springs 5c and 5d', when one of the rectangularly-shaped terminals vibrates, although its diagonally positioned rectangularly-shaped terminal simultaneously vibrates, the other rectangularly-shaped terminals never simultaneously vibrate, i.e., never resonate. Thus, the vibration of the leaf springs 5c and 5d' can be suppressed, so that the repeated lightening and darkening of the LED element 1 can be prevented, and the LED element 1 can remain securely fixed to the mounting substrate 3.

Figure 10:
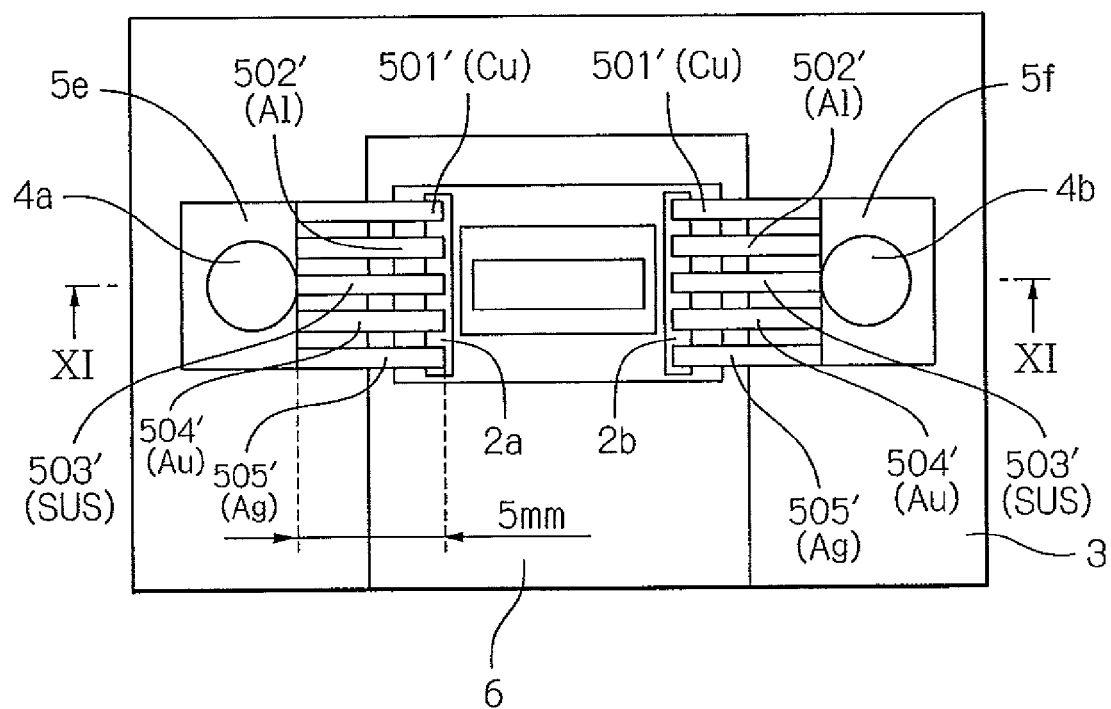
FIG. 10 is a plan view illustrating a second embodiment of the optical semiconductor device module according to the presently disclosed subject matter.
Figure 11:
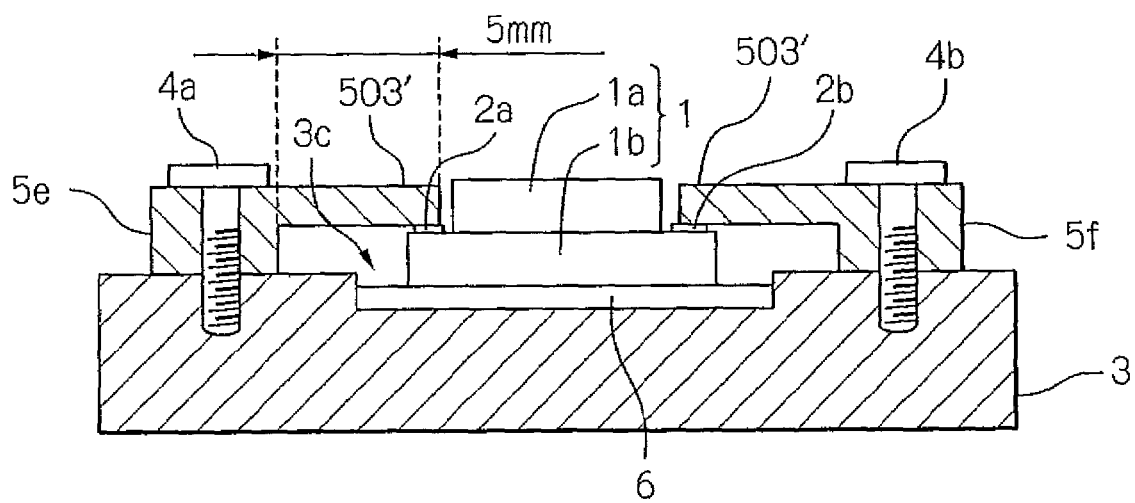
FIG. 11 is cross-sectional view taken along the line XI-XI of FIG. 10.

FIG. 10 is a plan view illustrating a second embodiment of the optical semiconductor device module according to the presently disclosed subject matter, and FIG. 11 is a cross-sectional view taken along the line XI-XI of FIG. 10. In FIGS. 10 and 11, leaf springs 5e and 5f are provided instead of the leaf springs 5a and 5b, respectively, of FIGS. 4, 5A, 5B and 5C.

Each of the leaf springs 5e and 5f is constructed by five rectangularly-shaped terminals 501', 502', 503', 504' and 505', each serving as a spring member. The materials of the rectangularly-shaped terminals 501', 502', 503', 504' and 505' are different from each other. For example, in view of workability and conductivity,

501': copper (Cu)
502': aluminum (Al)
503': 18Cr-8Ni stainless alloy (SUS304)
504': gold (Au)
505': silver (Ag)

Therefore, since the materials are so different that the Young's moduluses E are different (see: formula (1)), the natural frequencies of the rectangularly-shaped terminals 501', 502', 503', 504' and 505' are different from each other.

Note that the natural frequencies of first-order oscillation of brass, copper, aluminum, SUS304, gold and silver are shown in Table of FIG. 12 where the thickness is 1 mm, the width is 1 mm, and the length is 1, 2, 3, 4 and 5 mm.

Thus, in the optical semiconductor device module of FIGS. 10 and 11, the vibration (resonance) of the rectangularly-shaped terminals 501', 502', 503', 504' and 505' can be suppressed. Therefore, repeated lightening and darkening of the LED element 1 and separation of the LED element 1 from the mounting substrate 3 can be prevented.

Figure 13:
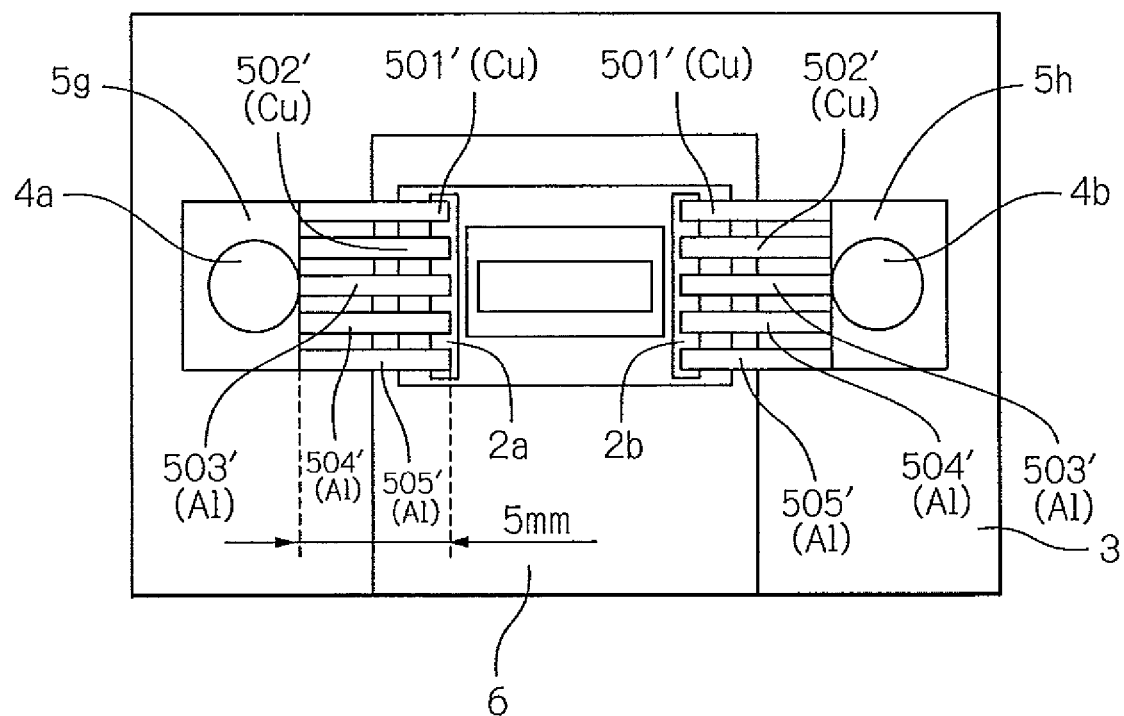
FIGS. 13, 14 and 15 are plan views illustrating first, second and third modifications, respectively, of the optical semiconductor device module of FIG. 10.

In FIG. 13, which illustrates a first modification of the optical semiconductor device module of FIG. 10, leaf springs 5g and 5h are provided instead of the leaf springs 5e and 5f, respectively, of FIG. 10.

Each of the leaf springs 5g and 5h is constructed by five rectangularly-shaped terminals 501', 502', 503', 504' and 505', whose materials are as follows:

501': copper (Cu)
502': copper (Cu)
503': aluminum (Al)
504': aluminum (Al)
505': aluminum (Al)

Therefore, the natural frequency of the rectangularly-shaped terminals 501' and 502' is different from that of the rectangularly-shaped terminals 503', 504' and 505'. As a result, in each of the leaf springs 5g and 5h, even when the rectangularly-shaped terminals 501' and 502' simultaneously vibrate, i.e., resonate, the rectangularly-shaped terminals 503', 504' and 505' never simultaneously vibrate, i.e., never resonate. Similarly, in each of the leaf springs 5g and 5h, even when the rectangularly-shaped terminals 503', 504' and 505' simultaneously vibrate, i.e., resonate, the rectangularly-shaped terminals 501' and 502' never simultaneously vibrate, i.e., never resonate. Thus, the vibration of the leaf springs 5g and 5h can be suppressed, so that the repeated lightening and darkening of the LED element 1 can be prevented, and the LED element 1 can remain securely fixed to the mounting substrate 3.

In FIG. 13, in each of the leaf springs 5g and 5h, the material of two rectangularly-shaped terminals is different from that of three rectangularly-shaped terminals. However, in each of the leaf springs 5g and 5h, only when the materials of at least two rectangularly-shaped terminals are different from each other, can the vibration of the leaf springs 5g and 5h be prevented.

Figure 14:
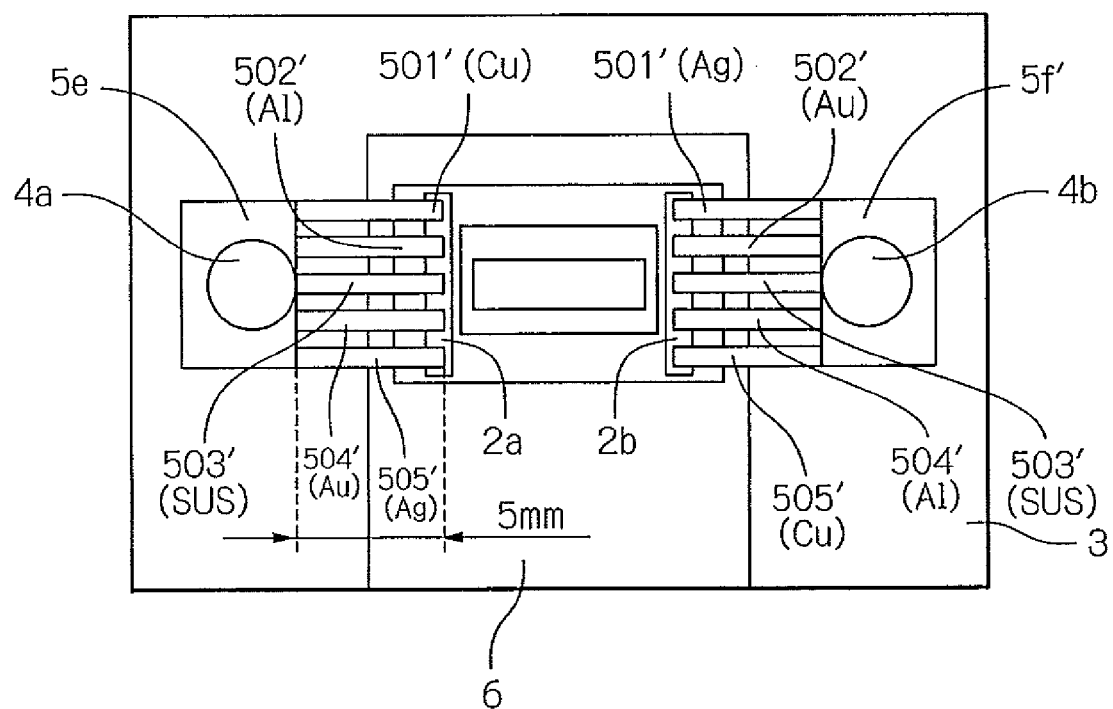

In FIG. 14, which illustrates a second modification of the optical semiconductor device module of FIG. 10, a leaf spring 5f' is provided instead of the leaf spring 5f of FIG. 10.

The sequence of the materials of the rectangularly-shaped terminals 501', 502', 503', 504' and 505' of the leaf spring 5f' is reverse to that of the leaf spring 5e of FIG. 10. That is, the rectangularly-shaped terminals 501', 502', 503', 504' and 505' of the leaf spring 5e have materials as follows:

501': copper (Cu)
502': aluminum (Al)
503': SUS304
504': gold (Au)
505': silver (Ag)

On the other hand, the rectangularly-shaped terminals 501', 502', 503', 504' and 505' of the leaf spring 5f' have materials as follows:

501': silver (Ag)
502': gold (Au)
503': SUS304
504': aluminum (Al)
505': copper (Cu)

As a result, the rectangularly-shaped terminals 501', 502', 503', 504' and 505' of the leaf spring 5e are symmetrical to the rectangularly-shaped terminals 501', 502', 503', 504' and 505' of the leaf spring 5f' with respect to the LED element 1. Therefore, in each of the leaf springs 5e and 5g', when one of the rectangularly-shaped terminals vibrates, although its diagonally positioned rectangularly-shaped terminal simultaneously vibrates, the other rectangularly-shaped terminals never simultaneously vibrate, i.e., never resonate. Thus, the vibration of the leaf springs 5e and 5f' can be suppressed, so that the repeated lightening and darkening of the LED element 1 can be prevented, and the LED element 1 can remain securely fixed to the mounting substrate 3.

Figure 15:
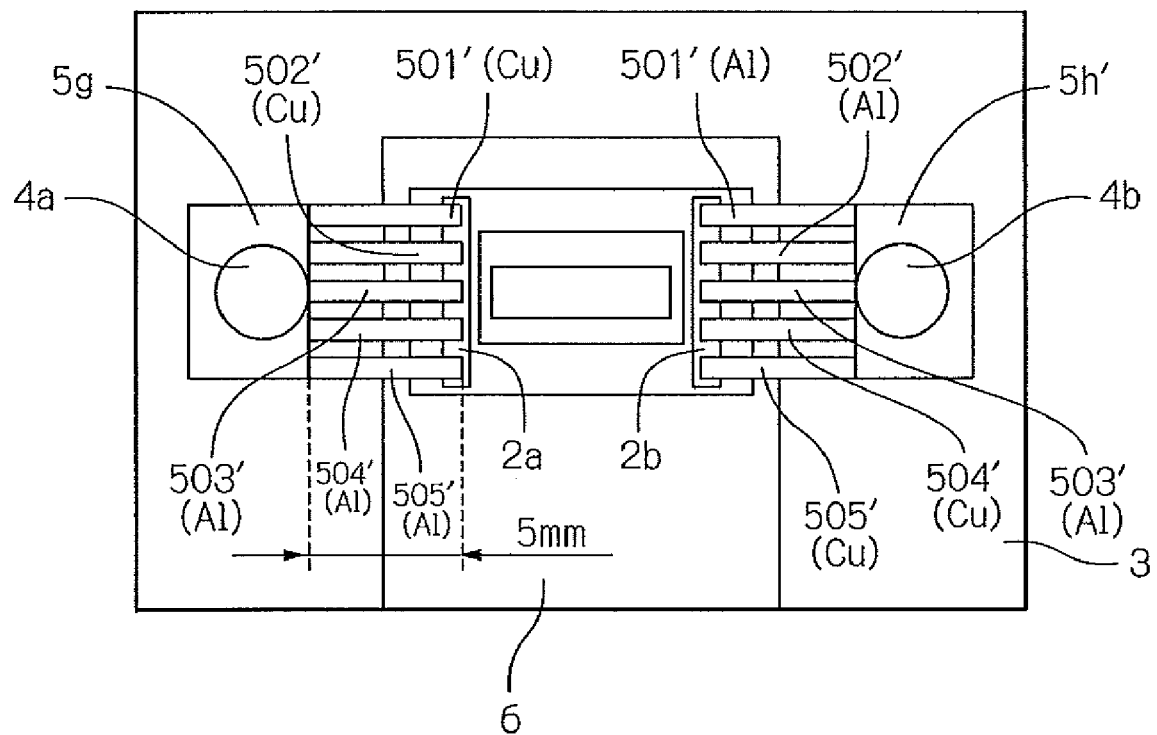

In FIG. 15, which illustrates a third modification of the optical semiconductor device module of FIG. 10, a leaf spring 5h' is provided instead of the leaf spring 5h of FIG. 13.

The third modification can be obtained by combining the first modification with the third modification. That is, the rectangularly-shaped terminals 501', 502', 503', 504' and 505' of the leaf spring 5g have materials as follows:
501': copper (Cu)
502': copper (Cu)
503': aluminum (Al)
504': aluminum (Al)
505': aluminum (Al)

On the other hand, the rectangularly-shaped terminals 501', 502', 503', 504' and 505' of the leaf spring 5h' have materials as follows:
501': aluminum (Al)
502': aluminum (Al)
503': aluminum (Al)
504': copper (Cu)
505': copper (Cu)

As a result, even when the rectangularly-shaped terminals 501' and 502' of the leaf spring 5g or the rectangularly-shaped terminals 504' and 505' of the leaf spring 5h' simultaneously vibrate, i.e., resonate, the rectangularly-shaped terminals 503', 504' and 505' of the leaf spring 5g or the rectangularly-shaped terminals 501', 502' and 503' of the leaf spring 5h' never simultaneously vibrate, i.e., never resonate. Similarly, even when the rectangularly-shaped terminals 503', 504' and 505' of the leaf spring 5g or the rectangularly-shaped terminals 501', 502' and 503' of the leaf spring 5h' simultaneously vibrate, i.e., resonate, the rectangularly-shaped terminals 501' and 502' of the leaf spring 5g or the rectangularly-shaped terminals 504' and 505' of the leaf spring 5h' never simultaneously vibrate, i.e., never resonate. Also, the rectangularly-shaped terminals 501', 502', 503', 504' and 505' of the leaf spring 5g are symmetrical to the rectangularly-shaped terminals 501', 502', 503', 504' and 505' of the leaf spring 5h' with respect to the LED element 1. Therefore, in each of the leaf springs 5g and 5h', when one of the rectangularly-shaped terminals vibrates, although its diagonally positioned rectangularly-shaped terminal simultaneously vibrates, the other rectangularly-shaped terminals never simultaneously vibrate, i.e., never resonate. Thus, the vibration of the leaf springs 5g and 5h' can be suppressed, so that the repeated lightening and darkening of the LED element 1 can be prevented, and the LED element 1 can remain securely fixed to the mounting substrate 3.

In the above-described second embodiment, the materials of the rectangularly-shaped terminals are varied. Therefore, the rectangularly-shaped terminals are bonded to the body of each of the leaf springs 5e, 5f, 5f', 5g, 5h and 5h' by welds or brazing. In this case, plating material or its thickness can be changed instead of changing the materials of the rectangularly-shaped terminals. That is, the difference of plating material or its thickness makes the Young modulus E or the density in the formula (1) different, which makes the natural frequency f in the formula (1) different.

Also, in the above-described second embodiment, geometrical shapes such as thicknesses or cross sections of the rectangularly-shaped terminals can be varied instead of changing the materials of the rectangularly-shaped terminals, which makes geometrical moment I of inertia of the rectangularly-shaped terminals or the cross sections A in the formula (1) different, which also makes the natural frequencies f in the formula (1) different.

Figure 16A:
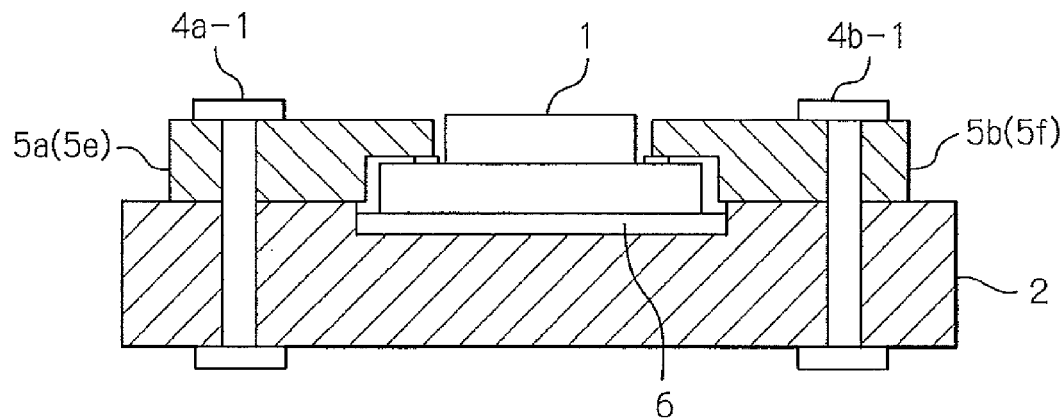
FIGS. 16A, 16B and 16C are cross-sectional views illustrating modifications of the modules of FIGS. 4 and 10 for fixing the LED element to the mounting substrate.
Figure 16B:
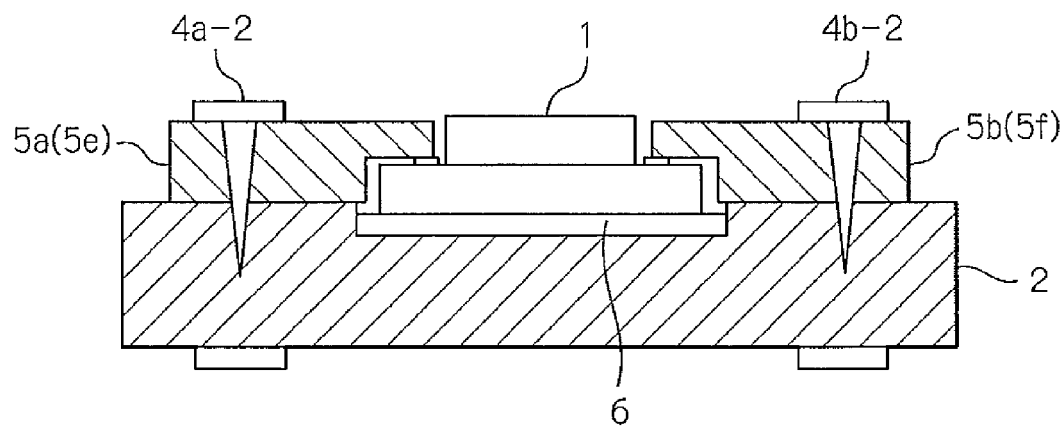
Figure 16C:
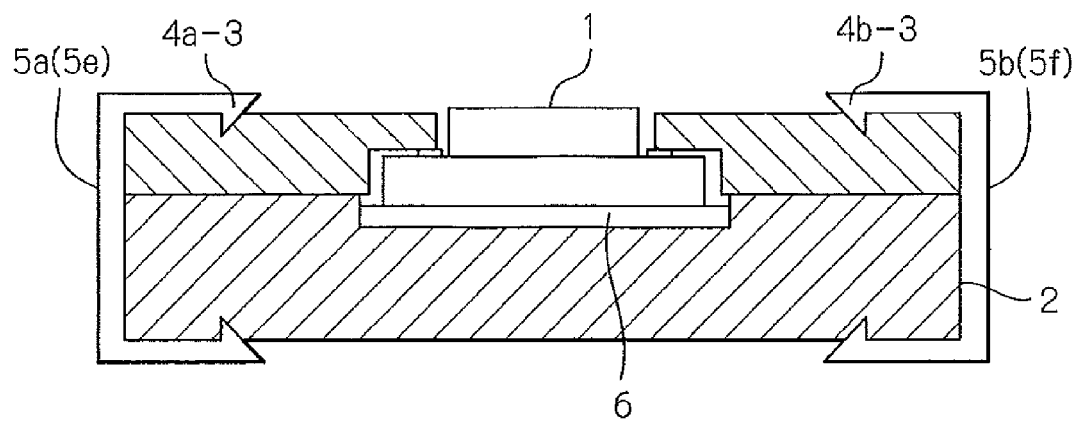

Further, rivets 4a-1 and 4b-1 as illustrated in FIG. 16A, press pins 4a-2 and 4b-2 as illustrated in FIG. 16B, or hocks 4a-3 and 4b-3 as illustrated in FIG. 16C can be used instead of the screws 4a and 4b of FIGS. 4 and 10.

It will be apparent to those skilled in the art that various modifications and variations can be made in the presently disclosed subject matter without departing from the spirit or scope of the invention. Thus, it is intended that the presently disclosed subject matter cover the modifications and variations of the presently disclosed subject matter provided they come within the scope of the appended claims and their equivalents. All related or prior art references described above and in the Background section of the present specification are hereby incorporated in their entirety by reference.

The invention claimed is:

1. An optical semiconductor device module, comprising:
an optical semiconductor device having a light emitting portion on its top surface;
a mounting substrate adapted to mount said optical semiconductor device thereon; and
at least one conductive leaf spring adapted to fix said optical semiconductor device to said mounting substrate and supply power to said optical semiconductor device,
said leaf spring comprising a plurality of rectangularly-shaped terminals, natural frequencies of at least two of said rectangularly-shaped terminals being different from each other.

2. The optical semiconductor device module as set forth in claim 1, wherein lengths of said at least two rectangularly-shaped terminals are different from each other.

3. The optical semiconductor device module as set forth in claim 1, wherein materials of said at least two rectangularly-shaped terminals are different from each other.

4. The optical semiconductor device module as set forth in claim 1, wherein geometrical shapes of said at least two rectangularly-shaped terminals are different from each other.

5. The optical semiconductor device module as set forth in claim 1, wherein thicknesses of said at least two rectangularly-shaped terminals are different from each other.

6. The optical semiconductor device module as set forth in claim 1, wherein cross sections of said at least two rectangularly-shaped terminals are different from each other.

7. The optical semiconductor device module as set forth in claim 1, further comprising one of a screw, a rivet, a press pin and a hock member adapted to fix said leaf spring to said mounting substrate.

8. The optical semiconductor device module as set forth in claim 1, wherein said mounting substrate comprises a heat sink.

9. The optical semiconductor device module as set forth in claim 1, further comprising a heat dissipating grease layer between said optical semiconductor device and said mounting substrate.

10. An optical semiconductor device module comprising:
an optical semiconductor device having a light emitting portion on its top surface;
a mounting substrate adapted to mount said optical semiconductor device thereon; and
first and second conductive leaf springs adapted to fix said optical semiconductor device to said mounting substrate and supply power to said optical semiconductor device,
each of said leaf springs comprising a plurality of rectangularly-shaped terminals, natural frequencies of at least two of said rectangularly-shaped terminals being different from each other,
the plurality of rectangularly-shaped terminals of said first conductive leaf spring being symmetrical to the plurality of rectangularly-shaped terminals of said second conductive leaf spring with respect to said optical semiconductor device.

11. The optical semiconductor device module as set forth in claim 10, wherein lengths of said at least two rectangularly-shaped terminals are different from each other.

12. The optical semiconductor device module as set forth in claim 10, wherein materials of said at least two rectangularly-shaped terminals are different from each other.

13. The optical semiconductor device module as set forth in claim 10, wherein geometrical shapes of said at least two rectangularly-shaped terminals are different from each other.

14. The optical semiconductor device module as set forth in claim 10, wherein thicknesses of said at least two rectangularly-shaped terminals are different from each other.

15. The optical semiconductor device module as set forth in claim 10, wherein cross sections of said at least two rectangularly-shaped terminals are different from each other.

16. The optical semiconductor device module as set forth in claim 10, further comprising one of a screw, a rivet, a press pin and a hock member adapted to fix each of said first and second leaf springs to said mounting substrate.

17. The optical semiconductor device module as set forth in claim 10, wherein said mounting substrate comprises a heat sink.

18. The optical semiconductor device module as set forth in claim 10, further comprising a heat dissipating grease layer between said optical semiconductor device and said mounting substrate.

* * * * *